(12) United States Patent
Kalvaitis et al.

(10) Patent No.: US 7,477,711 B2
(45) Date of Patent: Jan. 13, 2009

(54) SYNCHRONOUS UNDERSAMPLING FOR HIGH-FREQUENCY VOLTAGE AND CURRENT MEASUREMENTS

(75) Inventors: Tim Kalvaitis, Nashua, NH (US); Siddharth P. Nagarkatti, Acton, MA (US)

(73) Assignee: MKS Instruments, Inc., Wilmington, MA (US)

( * ) Notice: Subject to any disclaimer, the term of this patent is extended or adjusted under 35 U.S.C. 154(b) by 656 days.

(21) Appl. No.: 11/132,551

(22) Filed: May 19, 2005

(65) Prior Publication Data

US 2006/0262889 A1 Nov. 23, 2006

(51) Int. Cl.
H04L 7/00 (2006.01)

(52) U.S. Cl. .................. 375/355; 375/147; 375/150; 375/354

(58) Field of Classification Search .......... 375/146, 375/147, 150, 355

See application file for complete search history.

(56) References Cited

U.S. PATENT DOCUMENTS

| | | | | |
|---|---|---|---|---|
| 5,565,737 | A | 10/1996 | Keane | 315/111.21 |
| 5,770,922 | A | 6/1998 | Gerrish et al. | 315/111.21 |
| 2001/0045427 | A1* | 11/2001 | Thompson et al. | 219/665 |
| 2002/0047543 | A1* | 4/2002 | Sugai et al. | 315/111.21 |
| 2004/0135590 | A1* | 7/2004 | Quon | 324/713 |
| 2004/0174832 | A1* | 9/2004 | Geiger et al. | 370/295 |
| 2005/0171992 | A1* | 8/2005 | Tanaka et al. | 708/819 |
| 2005/0177758 | A1* | 8/2005 | Stickle | 713/400 |

FOREIGN PATENT DOCUMENTS

EP 1 244 133 A2 9/2002

OTHER PUBLICATIONS

Computation of average values of synchronously sampled signals, Pejovic, P., Saranovac, L., Popovic, M., Electric Power Applications, IEE Proceedings, Publication Date: May 2002, vol. 149, Issue: 3, On pp. 217-222.*
UK Examination Report Under Section 18(3) for corresponding application No. GB0722655.8, 2 pp, May 7, 2008.

* cited by examiner

*Primary Examiner*—Shuwang Liu
*Assistant Examiner*—Kenneth Lam
(74) *Attorney, Agent, or Firm*—McDermott Will & Emery, LLP

(57) ABSTRACT

A power source may generate signals (RF or microwave), when driven by a drive signal from a controller. A sensor may measure the voltage and current of the signals generated by the power source, and may generate sensor signals representative of the measured voltage and current. A sampler may be configured to undersample the sensor signals, synchronously with the drive signal that drives the power source. The sampling frequency may be a scalar multiple of the fundamental frequency of the sensor signals. At RF frequencies, either synchronous undersampling or synchronous oversampling may be performed. At microwave frequencies, synchronous undersampling may be performed.

5 Claims, 10 Drawing Sheets

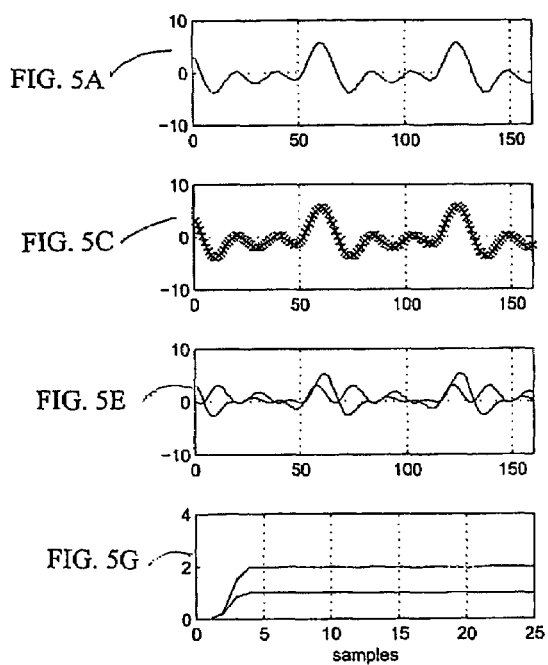
FIG. 5A
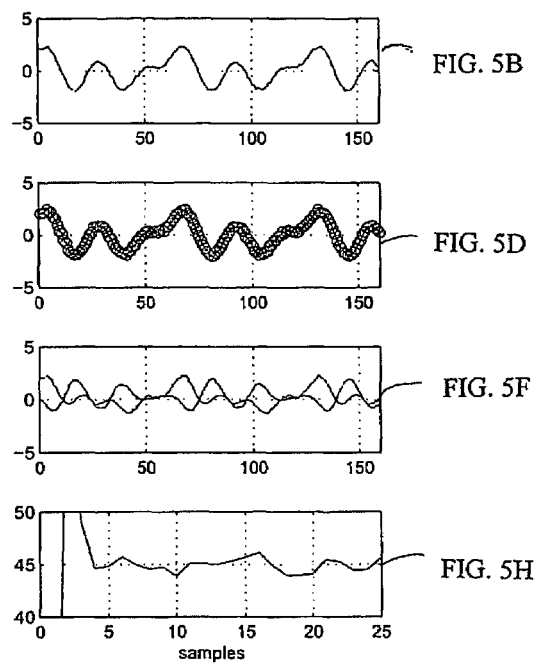
FIG. 5B
FIG. 5C
FIG. 5D
FIG. 5E
FIG. 5F
FIG. 5G
FIG. 5H

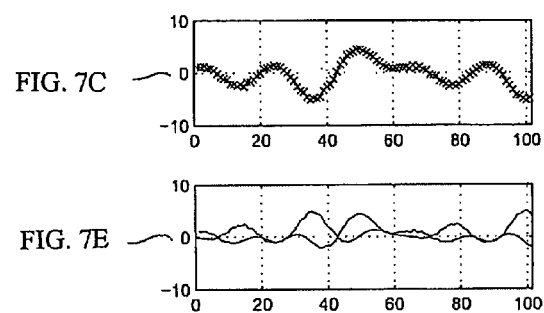
FIG. 7A
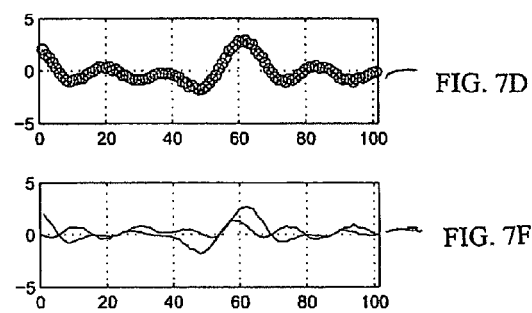
FIG. 7B
FIG. 7C
FIG. 7D
FIG. 7E
FIG. 7F
FIG. 7G
FIG. 7H

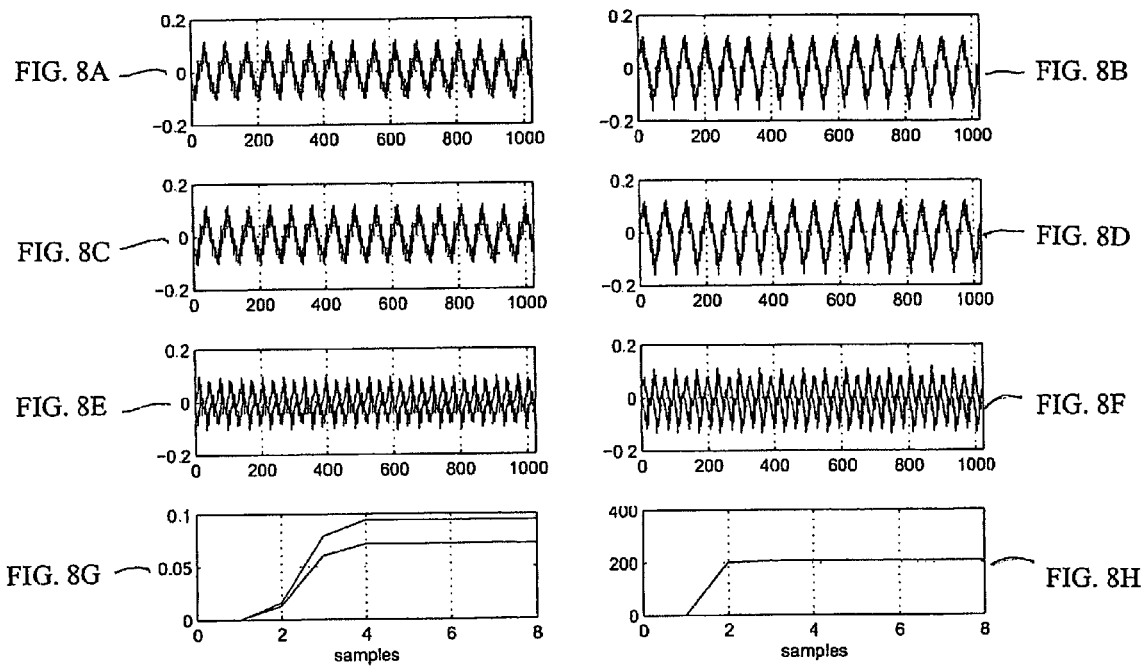

SYNCHRONOUS UNDERSAMPLING FOR HIGH-FREQUENCY VOLTAGE AND CURRENT MEASUREMENTS

BACKGROUND

In many applications, reliable and accurate measurements of high frequency voltage and current may be needed. Such applications may include, for example, RF plasma generation and RF plasma etching. A typical RF plasma generator may include a high power RF source that generates RF signals at a given frequency (for example 13.56 MH$_z$). The RF signals may be supplied to a plasma chamber. An impedance matching network may be provided between the RF power source and the plasma chamber, due to the considerable impedance mismatch that may exist between the RF power source and the plasma chamber. A VI (voltage-current) sensor or probe may be provided to detect the voltage and current of the RF signals as they enter the plasma chamber, and to generate sensor signals representative of the detected voltage and current.

The magnitude and phase of these high-frequency voltage and current measurements may have to be obtained accurately and repeatably. Digital operations (such as mixing and filtering) that are used to extract magnitude and phase information from the sensor signals may typically be performed using oversampling techniques, i.e. by sampling the data at frequencies equal to or higher than twice the highest frequency of interest, in accordance with the Nyquist criterion.

Oversampling techniques, however, may not accurately reconstruct the measured sensor signals, which may include multiple harmonics of a fundamental frequency, as well as magnitude and phase noise. Also, it may not be possible to implement oversampling techniques at microwave frequencies, for example 2.4 GHz, because at microwave frequencies the sampling frequency may have to be at least about 4.8 Gsps in order to satisfy Nyquist criterion. Currently available high-speed A/D (analog-to-digital) converters may only have sampling frequencies in the range of about 105 to about 400 Msps.

Fixed sampling frequencies may be used, for either oversampling or undersampling, when the analog signals from the VI sensor are sampled. These fixed sampling frequencies may be asynchronous with time-changing RF frequencies. The RF signals from the RF source (as well as the sensor signals) may have time-varying frequencies, however, as these signals are tuned in order to controllably adjust the impedance and to control the power delivered to the plasma chamber.

If a signal whose frequency changes with time is sampled at fixed frequencies, i.e. asynchronously, the signal measurements may degrade due to jitters or resonance. If measurements with jitter or resonance effects are used in high-speed closed loop control, the system performance may degrade quite dramatically.

SUMMARY

An apparatus may include a power source configured to generate signals when driven by a drive signal. The apparatus may further include a sensor configured to measure the voltage and current of the signals generated by the power source, and to generate sensor signals representative of the measured voltage and current. The apparatus may further include a sampler configured to undersample the sensor signals synchronously with the drive signal that drives the power source.

An apparatus may include a power source configured to generate signals when driven by a drive signal. The apparatus may further include a sensor configured to measure a voltage and a current supplied by the signals from the power source, and to generate sensor signals representative of the measured voltage and current. The sampler may be configured to oversample the sensor signals synchronously with the drive signal.

An apparatus may include means for generating signals in response to a drive signal. The apparatus may further include sensing means for measuring a voltage and a current supplied by the signals generated in response to the drive signal, and for generating sensor signals representative of the measured voltage and current. The apparatus may further include sampling means for undersampling the sensor signals synchronously with the drive signal.

A method may include measuring a voltage and a current supplied by signals from a power source that is driven by a drive signal, and generating sensor signals representative of the measured voltage and current. The method may further include undersampling the sensor signals synchronously with the drive signal that drives the power source.

BRIEF DESCRIPTION OF THE DRAWINGS

FIGS. 5A, 5B, 5C, 5D, 5E, 5F, 5G, and 5H illustrate the time response of synchronously undersampled RF voltage and current sensor signals in the presence of magnitude and phase noise and harmonics.

FIGS. 7A, 7B, 7C, 7D, 7E, 7F, 7G, and 7H illustrate synchronously undersampled microwave frequency voltage and current signals, in the presence of magnitude and phase noise and harmonics.

FIGS. 8A, 8B, 8C, 8D, 8E, 8F, 8G, and 8H illustrate experimental data that verify the accuracy of the synchronous undersampling technique, in the presence of noise and harmonics.

DETAILED DESCRIPTION

An apparatus and method are described for synchronous undersampling of high-frequency voltage and current measurements.

Figure 1:
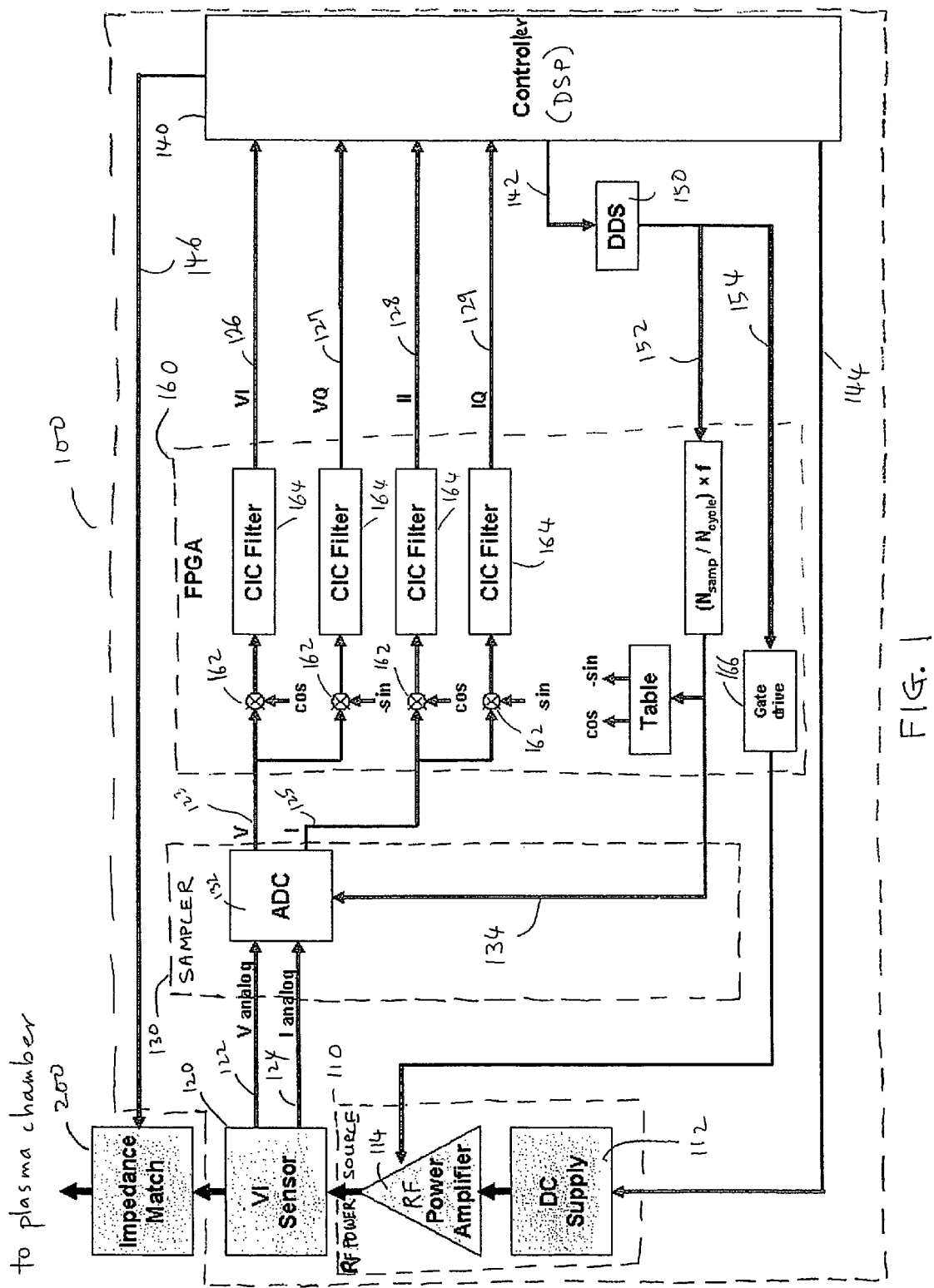
FIG. 1 is a schematic block diagram of one embodiment of an apparatus that implements a synchronous sampling technique to measure voltage and current from sensor signals.

FIG. 1 is a schematic block diagram of one embodiment of an apparatus 100 that implements a synchronous sampling technique to measure voltage and current from sensor signals. In overview, the apparatus 100 may include an RF (radio-frequency) power source 110, a sensor 120, a sampler 130, a controller 140, and a DDS (direct digital synthesizer) 150.

The RF power source 110 may generate RF signals in response to a drive signal generated by the DDS 150 at a frequency set by the controller 140, which may be a DSP (digital signal processor). The sensor 120 may detect the voltage and current of the RF signals, and may generate analog sensor signals representative of the measured voltage and current. The output from the sensor 120 may be fed to the sampler 130, which may undersample the sensor signals (at a frequency $f_s$), synchronously with the drive signal that drives the RF power source 110. In particular, the synchronous undersampling frequency $f_s$ may be a scalar multiple of the fundamental frequency of the sensor signals, as explained in more detail below. Although FIG. 1 illustrates a DDS as being used to generate a drive signal, other types of drive signal generators may be used in other embodiments of the apparatus.

In the illustrated embodiment, the apparatus 100 may be an RF generation apparatus, and may be part of an RF plasma system that delivers RF signals to a plasma chamber (not shown), for example a plasma chamber that is used in applications such as plasma etching. An impedance matching network 200 may be interposed between the RF generation apparatus 100 and the plasma chamber, in order to match the impedances between the RF generation apparatus and the plasma chamber, between which considerable impedance mismatch may exist.

Although FIG. 1 illustrates the generation and sampling of RF signals in the context of RF plasma systems, it should of course be understood that the synchronous undersampling technique described below may be used in any other applications that require precise and reliable voltage and current measurements at high frequencies. Further, although FIG. 1 illustrates RF signal generation and sampling, in other embodiments microwave frequency signals may also be generated and undersampled, using the techniques described below.

The RF power source 100 may be a tunable power source configured to generate RF signals at a tuned frequency. The RF power source 100 may include a DC power supply 112, and an RF power amplifier 114. The sensor 120 may be a VI (voltage-current) sensor or probe, in the illustrated embodiment. As shown in FIG. 1, the sensor outputs 122 and 124 may represent an RF line voltage and an RF line current, respectively. The sensor 120 may be disposed at a power input to the plasma chamber, to detect the voltage and the current of the RF signals, as the RF signals enter the plasma chamber. The voltage and current may have to be accurately measured as close to the plasma chamber as possible, in order to obtain a better indication of the plasma quality, and thus better control, e.g., the plasma etching characteristics of items being etched, such as wafers.

The sampler 130 may include an A/D (analog-to-digital) converter 132, and a sample clock 134. The A/D converter may receive the analog voltage signal 122 and the analog current signal 124, and digitize the signals 122 and 124 by sampling the analog signals at the sampling frequency $f_s$. The sample clock 134 may provide a timing reference to the A/D converter, by supplying sampling pulses to the A/D converter at a clock frequency. In other words, the A/D converter may control timing of the sampling according to the timing reference provided by the sample clock 134. The output from the A/D converter 132 is shown as a digital voltage (V) signal 123 and a digital current (I) signal 125.

The sampler 130 may implement synchronous undersampling, in which the output of the sensor 120 is sampled synchronously with the drive signal 152 (generated by the DDS 150) that drives the RF power source 110. The drive signal 152 controls the switching frequency of the RF power amplifier 114. The clock frequency of the sample clock 134 may be a scalar multiple of the frequency of the signal that controls the switching frequency of the RF power amplifier 114, i.e. a scalar multiple of the frequency of the drive signal 152. In the embodiment illustrated in FIG. 1, the DDS may also generate a signal 154 that sets the sample clock frequency to $$f_s = (N_{samp}/N_{cycles}) \times f,$$

where $N_{samp}$ denotes the number of samples obtained over $N_{cycles}$ cycles, and $_{samp}$ and $N_{cycles}$ are both integers.

The controller 140 may receive the undersampled sensor signals, and output one or more control signals that track the tuned frequency of the RF signals generated by the RF power source. The controller 140 may generate and transmit to the DDS a frequency command signal 142, in response to which the DDS may generate the drive signal 154 at the frequency specified by the frequency command signal. The frequency command signal 142 may be a numeric command, e.g. f=13.56 MHz, that tells the DDS 150 that the switching frequency of the RF amplifier 114 should be 13.56 MHz.

The controller 140 may also generate a capacitance command signal 146, and transmit the capacitance command signal 146 to the impedance matching network 200, so as to adjust the shunt capacitance in the matching network 200. In this way, the controller 140 may implement frequency tuning to improve impedance matching. The controller 140 may also generate a power command signal 144 that specifies a power level. The controller 140 may transmit the power command signal 144 to the power supply 112, thereby regulating the power delivered by the RF signals generated by the RF power source 110.

The apparatus 100 may further include an FPGA (field programmable gate array) 160, which reduces the sample rate of the A/D converter 132 to a rate manageable by the DSP controller 140, so that magnitude and phase information can be extracted from the undersampled signals coming from the sampler 130. As seen in FIG. 1, the digital voltage (V) and current (I) signals output from the sampler 130 may be connected to the FPGA 160, which may include digital mixers 162 that perform digital mixing, and CIC (cascade integrator comb) filters 164 that perform filtering and decimation. The FPGA 160 may further include a gate drive 166, which drives the FPGA at a frequency determined by the drive signal generated by the DDS in response to the frequency command signal from the controller 140.

The undersampled signals from the sampler 130 may be fed to the digital mixers 162, which convolve the sampled data with digital mixing signals generated by the DDS 150. As seen in FIG. 1, the sampled data may be convolved with a negative sine signal and a cosine signal. The convolved data may then be fed to the CIC filters 164 to extract the magnitude and phase from the undersampled signals. Decimation may be achieved by the CIC filters, i.e. the sample rate may be reduced by the CIC filters to a data rate that is given by the sample rate divided by a decimation factor. As the decimation factor increases, the data rate may be proportionally reduced. In the illustrated embodiment, a decimation factor of 128 may be used, although other embodiments may use different decimation factors.

The CIC filters 164 may each generate the following output signals, respectively: an in-phase voltage (VI) signal 126, an out-of-phase voltage (VQ) signal 127, an in-phase current (II) signal 128, and an out-of-phase current (IQ) signal 129. In other words, the output from the CIC filters 164 is shown as an in-phase (I) and an out-of-phase quadrature (Q) signal for each of the digital voltage (V) signal 123 and the digital current (I) signal 125, which both come out of the A/D converter 132 and are input into the FPGA 160, as seen in FIG. 1.

The clock that controls the digital mixers 162 and the CIC filters 164 also controls the A/D converter sampling, synchronously with the fundamental frequency of the sensor signals. In this way, synchronous undersampling is achieved. As the controller 140 changes the frequency of the RF signals generated by the power source 110, for example to control the impedance of the matching network 200, the sampling frequency $f_s$ is also changed, synchronously with the fundamental frequency of the sensor signals. As explained above, the controller 140 controls the frequency of the RF signals through the frequency command signal 142 that the controller 140 inputs to the DDS 150, which in turn generates the drive signal 154 that controls the switching frequency of the RF amplifier 114.

By undersampling the sensor signals, which typically may contain multiple harmonics as well as magnitude and phase noise, the shape of the VI sensor signals can be accurately reconstructed. Oversampling techniques, on the other hand, cannot accurately reconstruct the measured signals with harmonics, as shown in FIGS. 2A-2E and FIGS. 3A-3E.

Figure 2A:
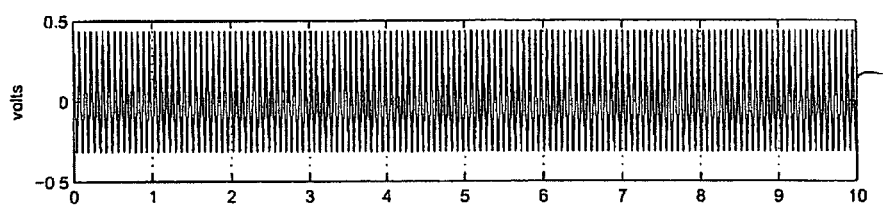
FIGS. 2A, 2B, 2C, 2D, and 2E illustrate oversampling of a voltage signal from a VI sensor.
Figure 2B:
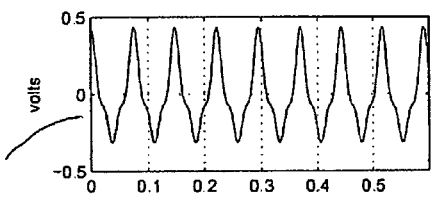
Figure 2C:
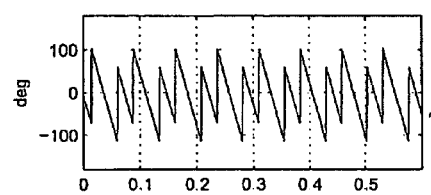

FIGS. 2A, 2B, 2C, 2D, and 2E illustrate oversampling of a voltage signal from a VI sensor, in a case where the fundamental frequency f of the sensor signals is given by f=13.56 MHz, and the sampling frequency $f_s$ is given by $f_s$=65. FIGS. 2A-2E illustrate asynchronous sampling at an 65 MHz sampling rate. FIG. 2A illustrates a sensor signal which has a fundamental frequency component at f=13.56 MHz, as well as 2nd and 3rd harmonics. FIG. 2B provides a zoom-in view of a 13.56 MHz signal, whereas FIG. 2C provides a zoom-in view of the actual phase angle.

Figure 2D:
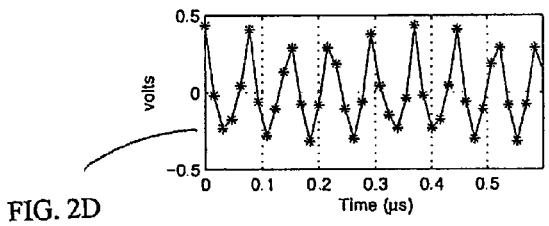
Figure 2E:
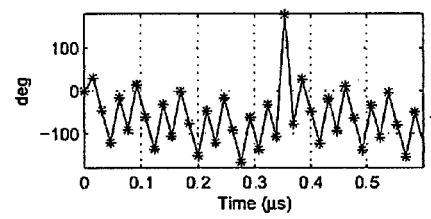

FIG. 2D illustrates the 13.56 MHz signal that is asynchronously oversampled at a sampling frequency of 65 MHz. FIG. 2D shows that the samples do not repeat at fixed phase offsets within each cycle, and the harmonics are not captured. The negative peak is detected only at 0.185 μs and at 0.554 μs, and the positive peak is detected only at 0 μs and 0.369 μs. FIG. 2E illustrates the oversampled phase angle. When FIG. 2E is compared with FIG. 2C, it is shown that the instantaneous phase is inaccurate when oversampling is used.

FIGS. 3A, 3B, 3C, 3D, and 3E illustrate a special example of asynchronous oversampling of a voltage signal from a VI sensor, where the sampling frequency is an integer multiple of the frequency of interest, i.e.:

$$f_{samp} = nf \; \forall n=1,2,3 \ldots$$

Figure 3A:
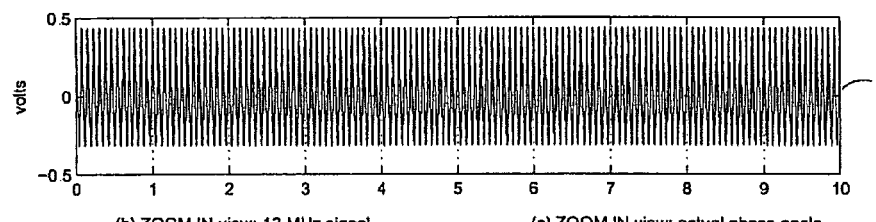
FIGS. 3A, 3B, 3C, 3D, and 3E illustrate another example of oversampling of a voltage signal from a VI sensor, at a sampling frequency that is an integer multiple of the fundamental frequency.
Figure 3B:
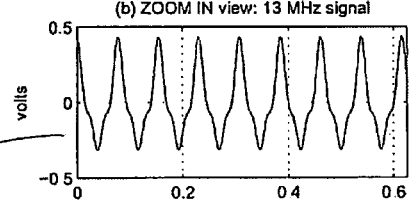
Figure 3C:
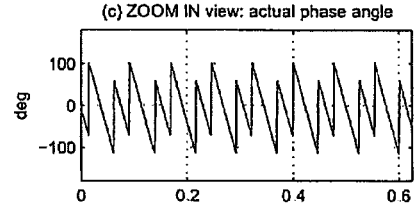

In the illustrated embodiment, $f_{samp}$=65 Msps and f=13 MHz, i.e. n=5. As in FIGS. 2A-2C, FIG. 3A illustrates a sensor voltage signal which has a fundamental frequency component at f=13 MHz, as well as 2nd and 3rd harmonics. FIG. 3B provides a zoom-in view of the 13 MHz signal, whereas FIG. 3C provides a zoom-in view of the actual phase angle.

Figure 3D:
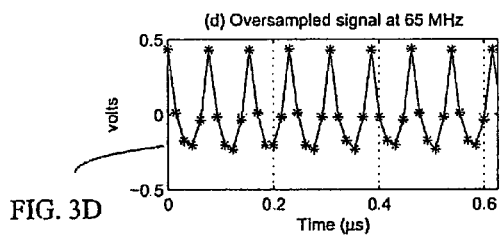

In the illustrated example, if the first sample occurs at an arbitrary $\theta_1 = (2\pi f)t$, then subsequent samples will repeat at $\theta_1 + 2\pi/5, \theta_1 + 4\pi/5, \theta_1 + 6\pi/5, \theta_1 + 8\pi/5$, and $\theta_1 + 2\pi$. Specifically, if $\theta_1 = 0$, then the peak of the f=13 MHz signal cannot be detected because the peaks would occur at π/4 and 3π/4 and for each cycle, whereas the signal is sampled at 0, 2π/5, 4π/5, 6π/5, 8π/5, and 2π. As seen in FIG. 3D, which shows the 13 MHz signal that is oversampled at a sampling frequency of 65 MHz, the negative peak is never detected when the signal is oversampled at an integer multiple of the frequency of interest, although the positive peak is detected in each cycle. Unlike FIG. 2D, the samples repeat at fixed offsets within each cycle. As in FIG. 2D, the harmonics are not captured.

Figure 3E:
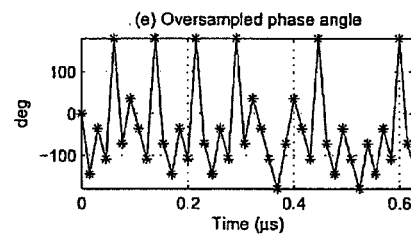

FIG. 3E illustrates the oversampled phase angle. Again, the instantaneous phase is inaccurate, as seen by comparing with FIG. 3C.

As explained earlier, oversampling techniques may not be implemented at microwave frequencies f=2.4 GHz(=2400 MHz) because, to satisfy the Nyquist criterion-based oversampling, the sampling frequency should be at least 4.8 Gsps (=4800 Msps). Currently available high-speed analog-to-digital converters, however, have sampling frequencies in the range 105 (AD6645: 14-bit) to 400 Msps (AD1240: 12-bit).

When fixed sampling frequencies are used, as in FIGS. 2A-2E and 3A-3E, the sampling frequency becomes asynchronous with time-changing RF frequencies, such as used in the apparatus 100 shown in FIG. 1. When a signal whose frequency changes with time is sampled at a fixed frequency, signal measurements may degrade due to jitters or resonance. If measurements with jitter or resonance effects are used in high-speed closed-loop control, the system performance may degrade considerably.

As explained earlier, the apparatus 100 shown in FIG. 1 implements synchronous undersampling of the sensor signals, i.e. the sampling rate is adjusted synchronously with the frequency of generation of the RF signals. Use of synchronous sampling ensures that, even if the RF signal generation frequency is changed, the sampler 130 still picks up the samples at the same points, and that the input to the DSP 140 is substantially independent of frequency. Synchronous sampling avoids the instabilities and inaccuracies that would result from asynchronous sampling, for example when multipoles are encountered.

By way of example, when beat frequencies between the RF signals from the RF power source 110 and the sampling clock 134 alias into the output bandwidth of the ADC 132, the measurements would be distorted, which in turn would severely degrade closed-loop control performance. This problem may be further exacerbated if the in-band beat frequency varied with time, as would occur if the RF signal frequency varies with time and the sampling frequency is fixed. Synchronization ensures that both the sampling clock and the signal that controls the RF switching vary simultaneously with time. This may eliminate time-varying beat frequencies and associated distortions.

In one embodiment, the sampling frequency $f_s$ may be chosen to be a scalar multiple of the fundamental frequency f. In particular, the synchronous undersampling frequency may be chosen to be proportional to the frequency of the sensor signal, but to slide in phase with successive samples to ensure that harmonics are picked up. The sliding effect may be achieved by ensuring that:

$$N_{samp} \neq N_{cycles},$$

and in the embodiment illustrated in FIG. 1, by ensuring that $$N_{samp} < N_{cycles}.$$

Specifically, in the embodiment illustrated in FIG. 1, the sampling frequency is selected to be:

$$f_{samp} = (N_{samp}/N_{cycles}) \times f \qquad \text{Eq. (1)}$$

and $$N_{samp} < N_{cycles},$$

where f is the VI sensor fundamental frequency, $N_{samp}$ denotes the number of samples obtained over $N_{cycles}$ cycles, and $N_{samp}$ and $N_{cycles}$ are both integers. The sampling frequency $f_{samp}$ may be less than 65 Msps, which is one of the fastest commercially available analog-to-digital converters.

The number of samples $N_{samp}$ and the number of cycles $N_{cycles}$ may satisfy the following equation:

$$N_{samp}=2^p, \quad N_{cycles}=(2^p)^q+1, \qquad \text{Eq. (2)}$$

where p and q are integers. For RF frequencies, p may be chosen to be 6, and q may be chosen to be 1. For microwave frequencies, p may be chosen to be 6, and q may be chosen to be 6.

In one specific embodiment of the apparatus 100, in which RF signals are generated and sampled, the following set of values may be chosen for the parameters f, $f_{samp}$, $N_{samp}$, and $N_{cycles}$: f=13.56 MHz; $N_{samp}$=64; $N_{cycles}$=65; and $f_{samp}$=13.351. In another specific embodiment, in which microwave frequency signals are generated and sample, the following set of values may be chosen for the parameters f, $f_{samp}$, $N_{samp}$, and $N_{cycles}$: f=2400 MHz; $N_{samp}$=64; $N_{cycles}$=4097; $f_{samp}$=37.4908. Different parameter values may be used in other embodiments.

In operation, a user of the apparatus 100 may control which point(s) on a sensor signal is sampled in a given period, while the sampling is still synchronous. In a particular example in which an RF signal of frequency f=13.56 MHz is used, a sample clock of $f_{samp}=(^{64}/_{65})\times 13.56$ MHz may be used, to sample the VI sensor signal at $\theta=2\pi k$ ($^{65}/_{64}$) for k=[0,64]. In this example, the zeroth sample may be taken in the zeroth period, i.e. (k=0) at θ=0°. The first sample may be taken at θ=365.625°, which occurs in the first period. The second sample may be taken at θ=731.25°, which occurs in the second period, and so forth.

The user may rely on the fact that because the signal is periodic, taking 2πk/64 samples in one period is the same as taking 1 sample/period over 65 periods. In other words, the user may assume that the signal at θ=5.625° is the same as θ=360+5.625°. The undersampling method may be equivalent to a sample rate of 64×13.56 MHz, except that 65 periods of the signal are required to build up a representation of one period. It is assumed that the shape and magnitude of the signal does not change beyond specified limits during those periods (65/13.56 MHz=4.79 μs).

FIGS. 4A-4E, 5A-5E, 6A-6C, and 7A-7C illustrate the robustness and accuracy of the synchronous undersampling technique described above. In these figures, the following voltage and current signals are used as inputs, with 3 harmonics, with different phase offset for each harmonic, and with magnitude noise and phase noise at the fundamental frequency:

$$v_{raw} = V_0\left[\cos\left(2\pi\frac{(i+8+\phi_{noise})}{64}\right) + \cos\left(2\pi\frac{(i+12)}{64}\right) + \cos\left(2\pi\frac{(i+18)}{64}\right)\right] + v_{noise} \qquad \text{Eq. (3)}$$

$$i_{raw} = I_0\left[\cos\left(2\pi\frac{(i+0+\phi_{noise})}{64}\right) + \cos\left(2\pi\frac{(i+36)}{64}\right) + \cos\left(2\pi\frac{(i+4)}{64}\right)\right] + i_{noise}, \qquad \text{Eq. (4)}$$

In the voltage and current signals given above, $$V_0=2 \qquad \text{Eq. (5)}$$

and $$I_0=1. \qquad \text{Eq. (6)}$$

The range of noise components are given by:

$\phi_{noise} \in [-2,2]$ samples, $v_{noise} \in [-0.167V_0, 0.167V_0]$, and $i_{noise} \in [-0.167I_0, 0.167I_0]$ Given that 64 samples represent 360° (one complete cycle), the phase noise of ±2 samples corresponds to +11.25° (=2/64×360). In addition, the phase difference between voltage and current at the fundamental frequency is 45°.

Figure 4A:
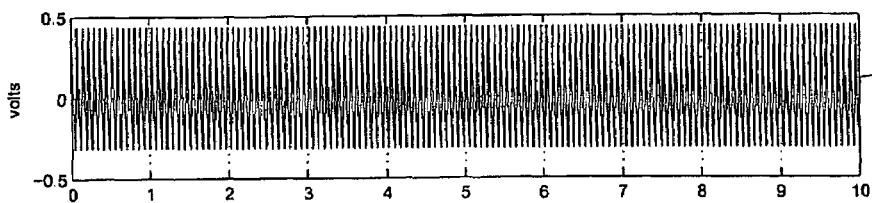
FIGS. 4A, 4B, 4C, 4D, and 4E illustrate synchronous undersampling of a voltage signal from a VI sensor.
Figure 4B:
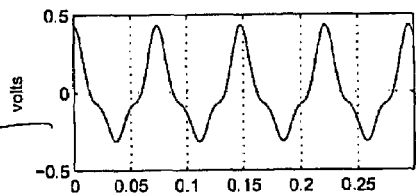
Figure 4C:
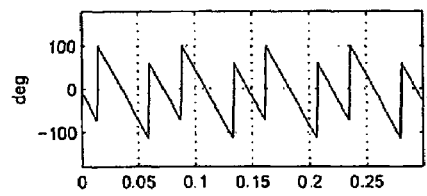

FIGS. 4A, 4B, 4C, 4D, and 4E illustrate synchronous undersampling of the voltage signal, from a VI sensor, having a fundamental frequency of f=13.56 MHz, and a sampling frequency $f_{samp}$ of 13.3514 Msps. As in FIGS. 2A-2C, FIG. 4A illustrates a sensor signal which has a fundamental frequency component at f=13.56 MHz, as well as 2nd and 3rd harmonics. FIG. 4B provides a zoom-in view of a 13.56 MHz signal, and FIG. 2C provides a zoom-in view of the actual phase angle.

Figure 4D:
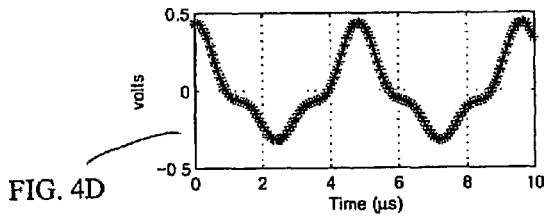
Figure 4E:
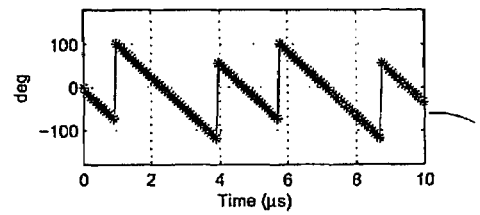

FIG. 4D illustrates the f=13.56 MHz signal synchronously undersampled at a sampling frequency of 13.3514 Msps. As seen from FIG. 4D, synchronous undersampling allows the exact waveform to be recreated, and allows the harmonics of the fundamental frequency to be captured. FIG. 4E illustrates the undersampled phase angle. As seen from FIG. 4E, the instantaneous phase within the measured cycle is accurate, when the sensor signal is synchronously undersampled. The curves shown in FIGS. 4D and 4E are the waveforms appearing at the output of the A/D converter 132.

FIGS. 5A, 5B, 5C, 5D, 5E, 5F, 5G, and 5H illustrate the time response of synchronously undersampled RF voltage and current sensor signals in the presence of magnitude and phase noise and harmonics. FIG. 5A illustrates a raw RF voltage signal, which includes harmonics of the fundamental frequency, as well as magnitude and phase noise. FIG. 5B illustrates a raw RF current signal, which also includes harmonics of the fundamental frequency, as well as magnitude and phase noise. FIGS. 5C and 5D illustrates the synchronously sampled voltage and current signals, respectively. As seen from FIGS. 5C and 5D, the shape of the voltage and current signals are accurately reconstructed, using synchronous undersampling.

FIGS. 5E and 5F illustrate the real and imaginary parts of the voltage signal and the current signal, respectively, after the mixing of −sin and cos signals by the digital mixers 162. FIG. 5G illustrates the decimated magnitudes of the voltage and the current, after the undersampled signals have gone through the CIC filters. From FIG. 5G, it is observed that $|V|=V_0=2$, and $|I|=I_0=1$, which is consistent with equations (5) and (6) above. FIG. 5H illustrates the decimated phase difference, after the undersampled signals have gone through the CIC filter. From FIG. 5H, it can be observed that the phase difference estimation is approximately 45 degrees, which is consistent with the prediction in paragraph [049]. As seen from FIGS. 5E-5H, synchronous undersampling of the voltage and current signals given in equations (3) and (4) above accurately estimates the magnitude and phase of the voltage and current.

Figure 6A:
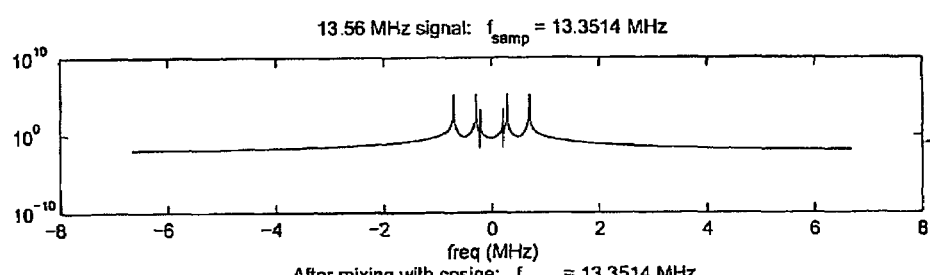
FIGS. 6A, 6B, and 6C illustrate the frequency response of synchronously undersampled RF voltage and current signals in the presence of significant sidebands.
Figure 6B:
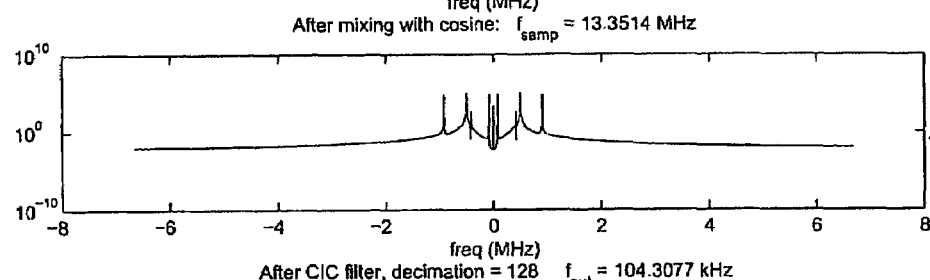
Figure 6C:
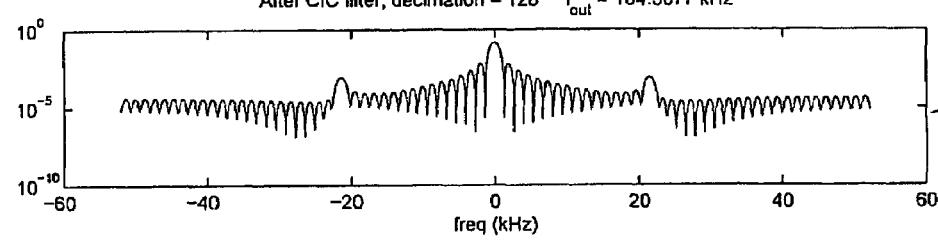

FIGS. 6A, 6B, and 6C illustrate the frequency response of synchronously undersampled RF voltage and current signals in the presence of significant sidebands. FIGS. 6A-6C represent simulation results where the fundamental frequency f=13.56 MHz is supplemented by harmonics as f ±500 kHz. FIG. 6A illustrates the frequency response of the 13.56 MHz signal sampled at a rate of 13.3514 MHz. FIG. 6B illustrates the signal after mixing with a cosine signal. FIG. 6C illustrates the signal after going through a CIC filter having a decimation factor of 128. Synchronous undersampling accurately estimates voltage and current magnitude and phase measurements, as seen from FIGS. 6A-6C, which illustrate the validity of the synchronous undersampling technique in the presence of significant sidebands.

FIGS. 6A-6C show that the values for $N_{samp}$ and $N_{cycles}$, in equation (2) above, may be selected appropriately such that any known sideband frequencies may be filtered out. In particular, FIGS. 6A-6C show that if the sidebands for a signal having a fundamental frequency of f=13.56 MHz occur at f ±500 kHz, selecting p=6, q=1 for equation (2) above ensures that these sidebands are filtered out.

FIGS. 7A, 7B, 7C, 7D, 7E, 7F, 7G, and 7H illustrate synchronous undersampling for microwave frequency voltage and current signals, in the presence of magnitude and phase noise and harmonics. FIGS. 7A and 7B illustrate raw microwave voltage and current signals, respectively, at a microwave frequency. The signals includes harmonics, as well as magnitude noise and phase noise. FIGS. 7C and 7D illustrate the synchronously undersampled voltage and current signals, respectively. 64 samples are taken in 4097 periods. The synchronously undersampled voltage and current signals accurately reconstruct the shape of the raw voltage and current signals, as seen by comparison with FIGS. 7A and 7B.

FIGS. 7E and 7F illustrate the real and imaginary parts of the voltage signal and the current signal, respectively, after the mixing of the –sine signal and cosine signals by the digital mixers 162. FIG. 7G illustrates the decimated magnitudes of the voltage and the current, after the undersampled signals have gone through the CIC filters. FIG. 7H illustrates the decimated phase difference, after the undersampled signals have gone through the CIC filter. FIGS. 7A-7H verify the same results as FIGS. 5A-5H above with 64 samples in 4097 cycles.

FIGS. 8A, 8B, 8C, 8D, and 8E illustrate actual experimental data. FIGS. 8A and 8B illustrate experimental data for the raw voltage and current signals, respectively, including harmonics as well as magnitude noise and phase noise. FIGS. 8C and 8D illustrate experimental data for the synchronously undersampled voltage and current signals, respectively. In FIGS. 8C and 8D, 64 samples are taken in 65 periods.

FIGS. 8E and 8F illustrate experimental data for the real and imaginary parts of the voltage signal and the current signal, respectively, after the mixing of –sin and cos signals by the digital mixers 162. FIG. 8G illustrates experimental data for the decimated magnitudes of the voltage and the current, after the undersampled signals have gone through the CIC filters. FIG. 8H illustrates experimental data for the decimated phase difference, after the undersampled signals have gone through the CIC filter. As seen from FIGS. 8A-8H, the experimental data verify the robustness and accuracy of the synchronous undersampling technique in the presence of noise and harmonics.

Figure 9:
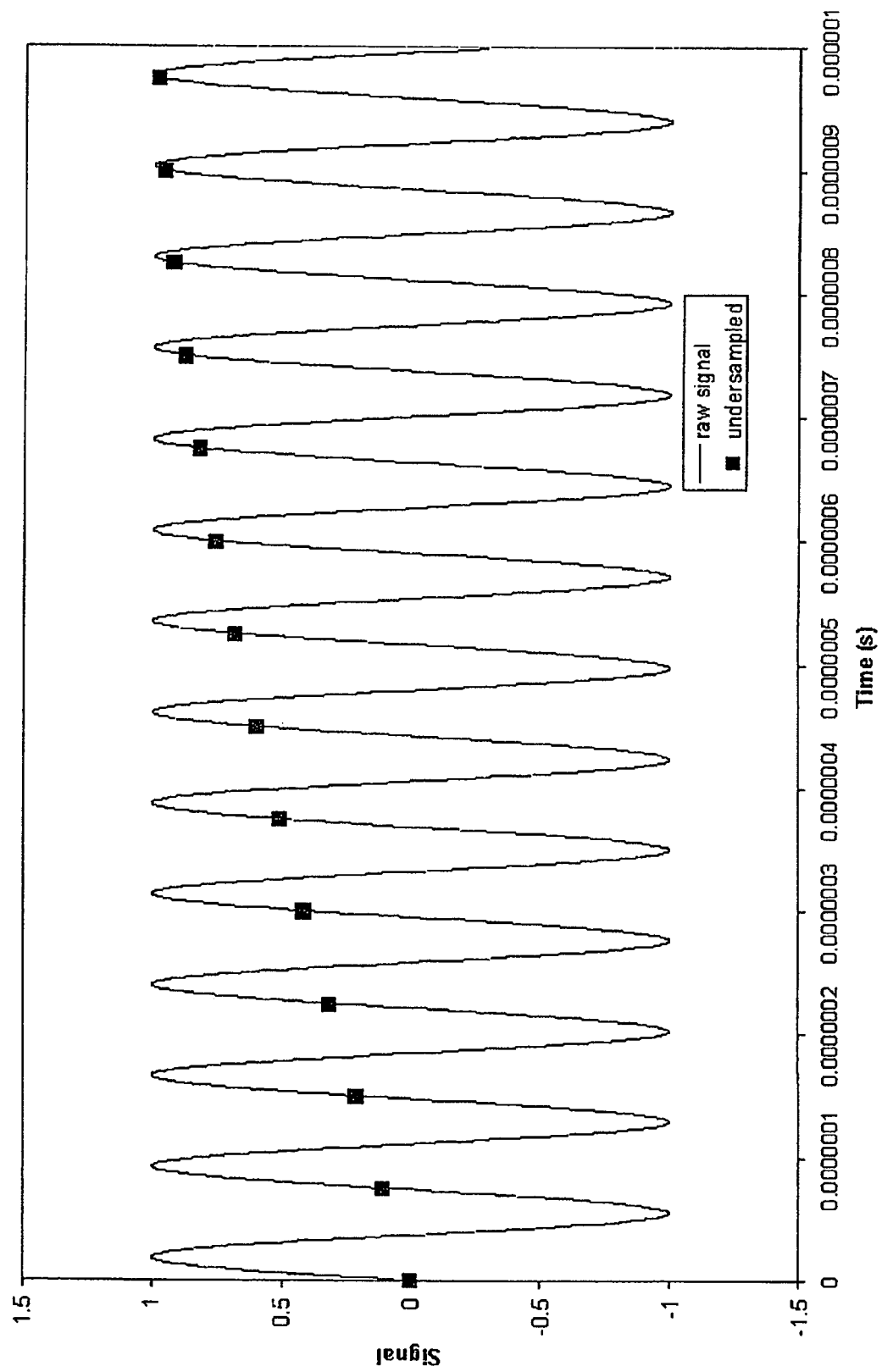
FIG. 9 illustrates an example of synchronous undersampling.
Figure 10:
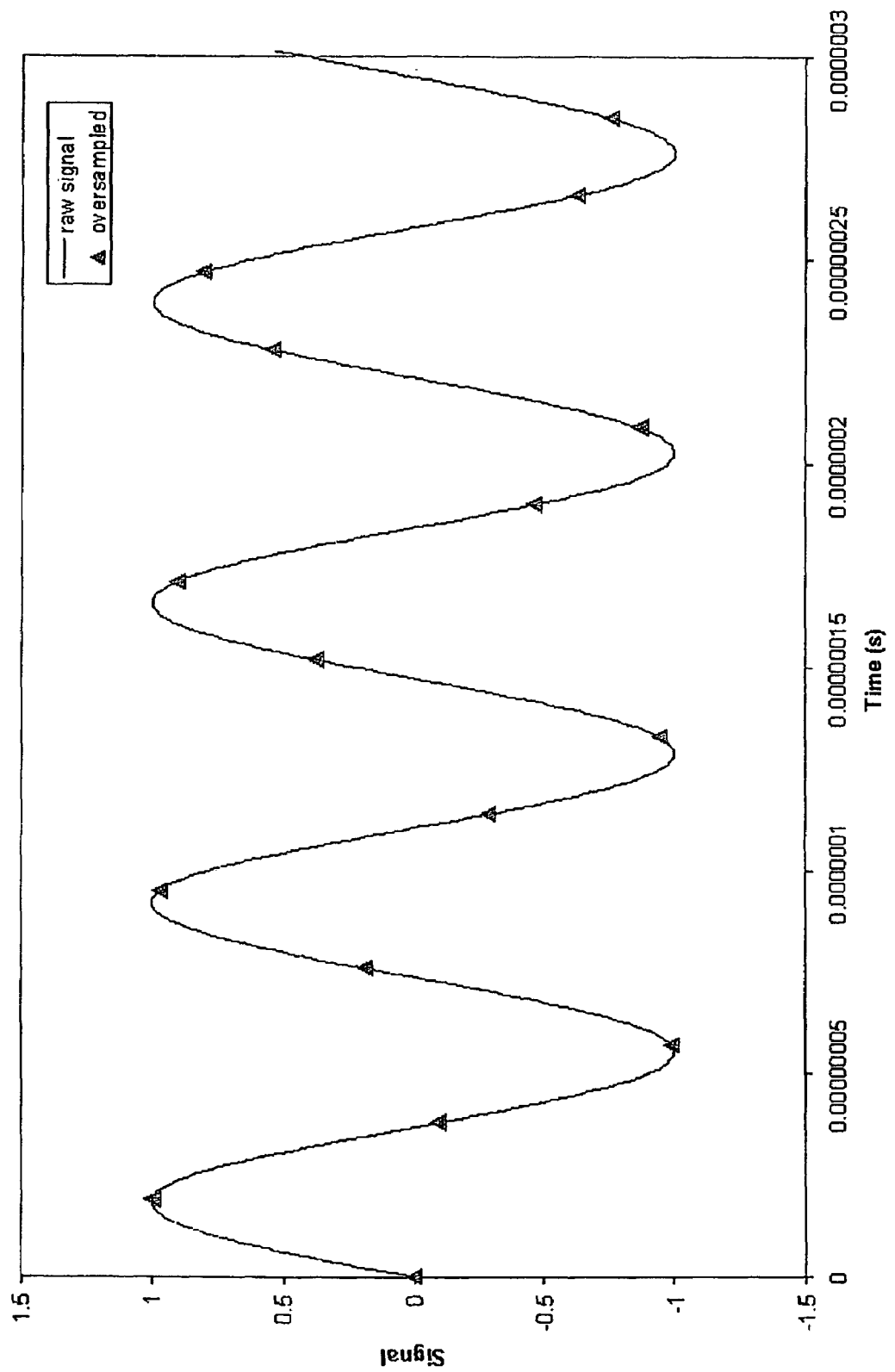
FIG. 10 illustrates an example of synchronous oversampling.

FIG. 9 illustrates an example of synchronous undersampling that captures 1 sample per cycle. For comparison, FIG. 10 illustrates an example of synchronous oversampling that captures 4 samples per cycle. In particular, FIG. 10 shows synchronous oversampling subject to $f_{samp}$<65 Msps, and $$f_{samp} = \frac{64 \times 4}{65} f.$$

In sum, a method and apparatus have been described that implement synchronous undersampling (for RF and microwave frequency signals) and synchronous oversampling (for RF signals) for high frequency voltage and current measurements. By undersampling, the VI sensor signals may accurately reconstructed. Using synchronous sampling, instabilities and inaccuracies resulting from jitters or resonance may be avoided. The magnitude and phase information may be obtained accurately and repeatably from high frequency voltage and current measurements. Closed-loop control performance may be improved, even in cases in which the contribution of harmonics is significant. Synchronous undersampling may also allow VI sensors to be used at higher frequencies (e.g. microwave frequencies), and may allow for quantification of harmonics and associated distortion by adjusting the clock frequency.

While certain embodiments have been described of an apparatus and method for implementing synchronous sampling techniques for high frequency voltage and current measurements, it is to be understood that the concepts implicit in these embodiments may be used in other embodiments as well. The protection of this application is limited solely to the claims that now follow.

In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus comprising:
   a power source configured to generate signals in response to a drive signal;
   a sensor configured to measure a voltage and a current of the signals generated by the power source, and to generate sensor signals representative of the measured voltage and current;
   a sampler configured to undersample the sensor signals synchronously with the drive signal that drives the power source, wherein the sampler comprises an A/D (analog-to-digital) converter and a sample clock, wherein the A/D converter is configured to control timing of samples in response to a timing reference provided by the sample clock,
   wherein the frequency of the sample clock is a scalar multiple of the frequency of the drive signal generated by a DDS (direct digital synthesizer);
   a controller configured to receive the undersampled sensor signals, and to generate a frequency command signal that sets a frequency, wherein the controller comprises a DSP (digital signal processor);
   a drive signal generator configured to generate the drive signal at the frequency set by the frequency command signal, wherein the drive signal generator comprises the DDS;
   one or more digital mixers configured to convolve the undersampled signals from the sampler with a sine wave signal and a cosine wave signal; and
   one or more CIC (cascade integrator comb) filters configured to decimate the convolved undersampled signals, thereby extracting from the undersampled signals information relating to magnitude and phase, wherein each one of the CIC filters are configured to generate one of an in-phase voltage signal, an out-of-phase voltage signal, an in-phase current signal, and an out-of-phase current signal.

2. The apparatus of claim 1, wherein the digital mixers are further configured to control timing of the convolving in response to the timing reference provided by the sample clock; and wherein the CIC filters are further configured to control timing of the decimation in response to the timing reference provided by the sample clock.

3. The apparatus of claim 1, wherein the sampler is configured to undersample the sensor signals at a sampling frequency $f_s$, wherein each one of the sensor signals comprises a component having a fundamental frequency f, and wherein the sampling frequency $f_s$ is a scalar multiple of the fundamental frequency f;

wherein the sampling frequency $f_s$ is related to the fundamental frequency f by an equation given by:

$$f_s = (N_{samp}/N_{cycles}) * f,$$

where $N_{cycles}$ is an integer denoting the number of cycles over which sampling is performed by the sampler, where $N_{samp}$ is an integer denoting the number of samples obtained over a number $N_{cycles}$ of cycles, and wherein $N_{samp}$ is different from $N_{cycles}$; and wherein $N_{samp}$ is related to an integer p in accordance with a formula given by:

$$N_{samp} = 2^p;$$

and wherein $N_{cycles}$ is related to the integer p and to another integer q in accordance with a formula given by:

$$N_{cycles} = (2^p)^q + 1.$$

4. The apparatus of claim 3, wherein the signals generated by the power source comprise RF signals, wherein p=6, and wherein q=1.

5. The apparatus of claim 3, wherein the signals generated by the power source comprise microwave frequency signals, wherein p=6, and wherein q=6.

* * * * *